(12) United States Patent
Konno et al.

(10) Patent No.: US 8,877,843 B2
(45) Date of Patent: Nov. 4, 2014

(54) RESIN COMPOSITION AND METHOD FOR PRODUCING CIRCUIT BOARD

(75) Inventors: Yuko Konno, Tokyo (JP); Hiromitsu Takashita, Osaka (JP); Tsuyoshi Takeda, Osaka (JP); Hiroaki Fujiwara, Nara (JP); Shingo Yoshioka, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/002,970

(22) PCT Filed: Nov. 28, 2011

(86) PCT No.: PCT/JP2011/006604
§ 371 (c)(1),
(2), (4) Date: Sep. 3, 2013

(87) PCT Pub. No.: WO2012/160617
PCT Pub. Date: Nov. 29, 2012

(65) Prior Publication Data
US 2013/0337188 A1    Dec. 19, 2013

(30) Foreign Application Priority Data

May 23, 2011    (JP) .................................. 2011-114652

(51) Int. Cl.
*H05K 1/03*    (2006.01)
*H05K 3/00*    (2006.01)
(Continued)

(52) U.S. Cl.
CPC .............. *H05K 1/0353* (2013.01); *C08K 5/005* (2013.01); *H05K 3/184* (2013.01); *C09D*
(Continued)

(58) Field of Classification Search
CPC ........ C08L 33/02; C09D 125/08; H05K 1/03; H05K 3/00

USPC ........................................ 524/91, 94; 427/555
See application file for complete search history.

(56) References Cited

U.S. PATENT DOCUMENTS

2004/0112634 A1    6/2004    Tanaka et al.
2006/0105544 A1*   5/2006    Takanashi et al. ............ 438/460
(Continued)

FOREIGN PATENT DOCUMENTS

JP    07-256832 A    10/1995
JP    07-281437 A    10/1995
(Continued)

OTHER PUBLICATIONS

Mehta, Ultraviolet-Visible (UV-Vis) Spectroscopy—Derivation of Beer-Lambert Law, accessed online at http://pharmaxchange.info/press/2012/04/ultraviolet-visible-uv-vis-spectroscopy-%e2%80%93-derivation-of-beer-lambert-law/.*

(Continued)

*Primary Examiner* — Michael M Bernshteyn
(74) *Attorney, Agent, or Firm* — McDermott Will & Emery LLP

(57) ABSTRACT

The present invention relates to a resin composition which includes a copolymer consisting of a first monomer containing a monomer unit having at least one carboxyl group and a second monomer copolymerizable with the first monomer, and also includes an ultraviolet absorber. The resin composition used is a resin composition for which, when $\in 1$ represents an absorbance coefficient per unit weight of a resin film 2 in a solution prepared by dissolving, in a solvent, the resin film 2 formed by application of the resin composition as a liquid, $\in 1$ at a light wavelength at which the resin film 2 is to be irradiated is at least 0.01 (L/(g·cm)).

13 Claims, 1 Drawing Sheet

(51) Int. Cl.
*C08L 33/02* (2006.01)
*C09D 125/08* (2006.01)
*H05K 3/18* (2006.01)
*H05K 3/10* (2006.01)
*C08K 5/00* (2006.01)

(52) U.S. Cl.
CPC .... 125/08 (2013.01); *H05K 3/0032* (2013.01); *H05K 2203/0565* (2013.01); *H05K 3/107* (2013.01); *H05K 2201/0239* (2013.01); *H05K 2201/0112* (2013.01); *C08L 33/02* (2013.01); *H05K 2203/0264* (2013.01); *H05K 3/0014* (2013.01); *H05K 2201/0209* (2013.01); *H05K 2203/0571* (2013.01)
USPC ............................... 524/91; 524/94; 427/555

(56) References Cited

U.S. PATENT DOCUMENTS

| | | | |
|---|---|---|---|
| 2009/0272562 A1 | 11/2009 | Yoshioka et al. | |
| 2010/0294423 A1* | 11/2010 | Takesue et al. | 156/247 |
| 2010/0304551 A1 | 12/2010 | Takanashi et al. | |

FOREIGN PATENT DOCUMENTS

| | | | |
|---|---|---|---|
| JP | 07256832 A | * | 10/1995 |
| JP | 11-212262 A | | 8/1999 |
| JP | 2000-231190 A | | 8/2000 |
| JP | 2001-201851 A | | 7/2001 |
| JP | 2001-226777 A | | 8/2001 |
| JP | 2002-121360 A | | 4/2002 |
| JP | 2005-290242 A | | 10/2005 |
| JP | 2006-140311 A | | 6/2006 |
| JP | 2008-242412 A | | 10/2008 |
| JP | 2008242412 A | * | 10/2008 |
| JP | 04-305995 B2 | | 7/2009 |
| JP | 2009-191089 A | | 8/2009 |
| JP | 2010-050435 A | | 3/2010 |
| JP | 2010-065109 A | | 3/2010 |
| JP | 2010-111729 A | | 5/2010 |
| JP | 2010-135768 A | | 6/2010 |
| KR | 10-2009-0066266 A | | 6/2009 |
| KR | 10-2010-0116171 A | | 10/2010 |

OTHER PUBLICATIONS

International Search Report issued in PCT/JP2011/006604, dated Dec. 20, 2011, with English translation.
Korean Office Action issued in corresponding Korean Patent Application on Dec. 10, 2013; 6 pages (in Korean language).

* cited by examiner

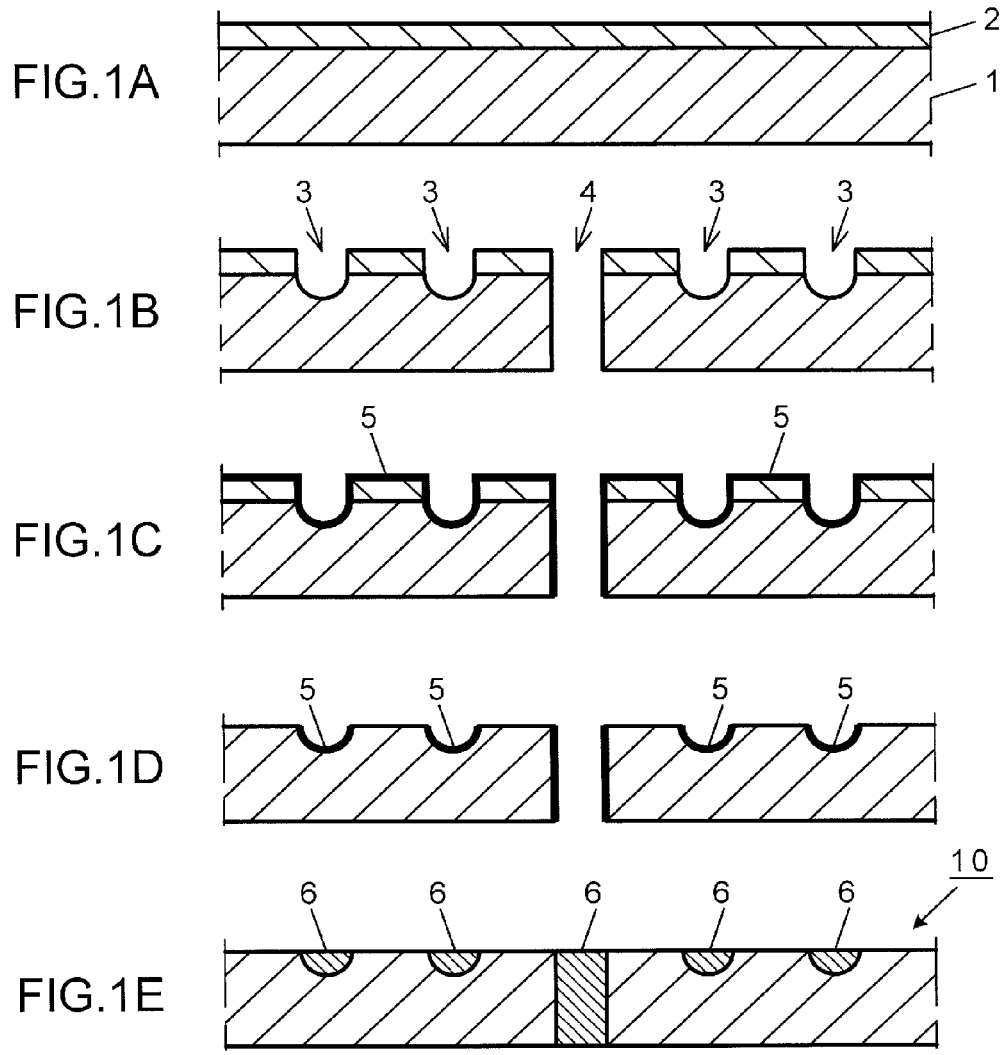

RESIN COMPOSITION AND METHOD FOR PRODUCING CIRCUIT BOARD

RELATED APPLICATIONS

This application is the U.S. National Phase under 35 U.S.C. §371 of International Application No. PCT/JP2011/006604, filed on Nov. 28, 2011, which in turn claims the benefit of Japanese Application No. 2011-114652, filed on May 23, 2011, the disclosures of which Applications are incorporated by reference herein.

TECHNICAL FIELD

The present invention relates to a resin composition and a method for producing a circuit board.

BACKGROUND ART

In recent years, the increasingly high density of electrical circuits in the field of electricity and electronics has been accompanied by a shift towards finer linewidths and narrower spaces between lines. However, as spaces between lines become narrower, shorts between lines and electromigration tend to arise.

The following circuit board production method is disclosed in Patent Document 1 as art capable of addressing this problem. First, a resin film is formed on the surface of an insulating substrate (resin film forming step). Next, a circuit pattern is created by forming recessed portions having a depth, with reference to an outer of the resin film, which is equal to or greater than the thickness of the resin film (circuit forming step). Then a plating catalyst or a precursor thereof is deposited on the surface of the circuit pattern and the surface of the resin film (catalyst deposition step). Next, the resin film is removed from the insulating substrate (film removal step). An electroless plating film is then formed only in areas where the plating catalyst or precursor thereof remains behind following removal of the resin film (plating treatment step). Such a production method makes it possible to form highly accurate electrical circuits on an insulating substrate, enabling a circuit board in which the occurrence of short circuits and electromigration is suppressed to be obtained.

In the foregoing production method, Patent Document 1 mentions laser processing as one method of forming the circuit pattern. In addition, Patent Document 1 states that the productivity is improved by using a resin film having a high absorbance at the characteristic wavelength of the laser light. However, specific art for increasing the absorbance of laser light by the resin film is not mentioned.

Patent Document 1: Japanese Patent Application Laid-open No. 2010-135768 (paragraphs 0018, 0100 and 0102)

SUMMARY OF THE INVENTION

It is therefore an object of the invention, in a circuit board production method which includes the step of forming a circuit pattern by irradiating, with laser light, a resin film that has been formed on the surface of an insulating substrate, to increase the absorbance of laser light by the resin film and thereby further improve the circuit board productivity.

Accordingly, in one aspect, the invention provides a resin composition which includes a copolymer consisting of a first monomer containing a monomer unit having at least one carboxyl group and a second monomer copolymerizable with the first monomer, and includes also an ultraviolet absorber, wherein, when $\in 1$ represents an absorbance coefficient per unit weight of a resin film in a solution prepared by dissolving, in a solvent, the resin film formed by application of the resin composition as a liquid, $\in 1$ at a light wavelength at which the resin film is to be irradiated is at least 0.01 (L/(g·cm)).

In another aspect, the invention provides a circuit board production method which includes the steps of forming a resin film on a surface of an insulating substrate by using the above resin composition; forming a circuit pattern by using laser processing to form recessed portions having a depth, with reference to an outer surface of the resin film, which is equal to or greater than a thickness of the resin film; depositing a plating catalyst or a precursor thereof on a surface of the circuit pattern and a surface of the resin film; removing the resin film from the insulating substrate; and forming an electroless plating film only in areas where the plating catalyst or precursor thereof remains behind following removal of the resin film.

This invention, in a circuit board production method which includes the step of forming a circuit pattern by irradiating, with laser light, a resin film that has been formed on the surface of an insulating substrate, makes it possible to increase the absorptance of laser light by the resin film and thereby improve the circuit board productivity.

BRIEF DESCRIPTION OF THE DRAWINGS

FIGS. 1A to 1E are flow diagrams of a circuit board production method according to an embodiment of the invention.

DESCRIPTION OF EMBODIMENTS

In the circuit forming step of the circuit board production method described in Patent Document 1, recessed portions having a depth which is the same as or greater than the thickness of the resin film are formed by laser processing; that is, a circuit pattern is formed. In such laser processing, if the resin film does not have an absorption wavelength in the same wavelength region as the wavelength of the laser light, the resin film has difficulty absorbing the laser light, as a result of which cleavage of the polymer molecules making up the resin film does not readily arise. Hence, most of the laser light that has irradiated the resin film is converted to heat energy, giving rise to thermal deformation of the resin film. As a result, after laser processing, the resin film at the periphery of the circuit pattern bulges or polymer components fall into the recessed portions of the circuit pattern and remain behind as residues, resulting in obstruction of the circuit pattern by molten polymer. When such an effect occurs, in the catalyst deposition step that follows, the plating catalyst is not deposited properly within the recessed portions of the circuit pattern and, ultimately, the desired electrical circuit is not easily obtained, resulting in a decline in circuit board productivity. Such undesirable effects become more pronounced at larger resin film thicknesses (e.g., at thicknesses of 3 μm and above).

Accordingly, there has existed a need for the development of resin films which, even when the resin film thickness is large (e.g., about 5 μm), have an excellent laser processability, making it possible to achieve an improved circuit board productivity.

The inventors have discovered that that this need can be addressed by using an ultraviolet absorber to increase the laser light absorptance of the resin film.

Hence, the resin composition according to the present embodiment is a resin composition which includes a copolymer that consists of first monomer containing a monomer unit having at least one carboxyl group and a second monomer copolymerizable with the first monomer, and includes also an ultraviolet absorber, wherein, when ∈1 represents an absorbance coefficient per unit weight of a resin film in a solution prepared by dissolving, in a solvent, the resin film formed by application of the resin composition as a liquid, ∈1 at a light wavelength at which the resin film is to be irradiated is at least 0.01 (L/(g·cm)).

In addition, the circuit board production method according to the present embodiment includes the steps of forming a resin film on a surface of an insulating substrate by using the above resin composition; forming a circuit pattern by using laser processing to form recessed portions having a depth, with reference to an outer surface of the resin film, which is equal to or greater than a thickness of the resin film; depositing a plating catalyst or a precursor thereof on a surface of the circuit pattern and a surface of the resin film; removing the resin film from the insulating substrate; and forming an electroless plating film only in areas where the plating catalyst or precursor thereof remains behind following removal of the resin film.

As shown in FIG. 1, the method for producing a circuit board 10 according to this embodiment has: (A) a resin film forming step which forms a resin film 2 on a surface of an insulating substrate 1; (B) a circuit forming step which forms a circuit pattern by using laser processing to form recessed portions 3, 4 having depths, with reference to an outer surface of the resin film 2, which are equal to or greater than the thickness of the resin film 2; (C) a catalyst deposition step which deposits a plating catalyst 5 or a precursor thereof on the surface of the circuit pattern and the surface of the resin film 2; (D) a film removing step which removes the resin film 2 from the insulating substrate 1; and (E) a plating treatment step which forms an electroless plating film 6 only in areas where the plating catalyst 5 or a precursor thereof remains behind following removal of the resin film 2.

First, as shown in FIG. 1A, in the resin film forming step, a resin film 2 is formed on a surface of an insulating substrate 1.

Then, as shown in FIG. 1B, in the circuit forming step, a circuit pattern is formed by using laser processing to form recessed portions 3, 4 having depths, with reference to an outer surface of the resin film 2, which are equal to or greater than the thickness of the resin film 2. The circuit pattern may consist of recessed portions that reach the surface of the insulating substrate 1, although in order to discourage the electrical circuit 6 ultimately obtained from detaching, recessed portions that extend into the insulating substrate 1 are more preferred.

In the diagram, the symbol 3 refers to circuit grooves which form part of the circuit pattern, and the symbol 4 refers to through-holes which similarly form part of the circuit pattern. The areas where the electroless plating film 6 (i.e., the electrical circuit) forms are defined by these circuit grooves 3 and through-holes 4. In the explanation that follows, the circuit pattern is described primarily in terms of the circuit grooves 3, although the same circumstances apply to the through-holes 4 as well. It should also be noted that the circuit grooves 3 are intended for the formation of, for example, interconnections in the electrical circuit 6, and that the through-holes 4 are intended for the formation of, for example, via holes in the electrical circuit 6.

Next, as shown in FIG. 1C, in the catalyst deposition step, a plating catalyst 5 or a precursor thereof is deposited on the surfaces of the circuit grooves 3 and on the surface of the resin film 2 where circuit grooves 3 were not formed.

Then, as shown in FIG. 1D, in the film removing step, the resin film 2 is removed from the insulating substrate 1. As a result, of the surface on the insulating substrate 1, the plating catalyst 5 or a precursor thereof remains behind only in those areas where circuit grooves 3 were formed. The plating catalyst 5 or a precursor thereof which was deposited on the surface of the resin film 2 is removed together with the resin film 2 while still supported thereon.

Then, as shown in FIG. 1E, in the plating treatment step, electroless plating is applied to the insulating substrate 1 from which the resin film 2 has been removed. As a result, an electroless plating film 6 is formed only in those areas where the plating catalyst 5 or a precursor thereof remains behind. That is, an electroless plating film that becomes an electrical circuit 6 is formed in those areas where circuit grooves 3 have been formed. The electrical circuit 6 may be composed solely of an electroless plating film, or the plating film may be made even thicker by applying additional electroless plating (referred to herein as "fill-up plating") to the electroless plating film. For example, as shown in the diagram, it is also possible to form an electrical circuit 6 formed of an electroless plating film in such a way as to bury all the circuit grooves 3 and through-holes 4, thereby eliminating steps between the insulating substrate 1 and the electrical circuit 6.

By way of these respective steps (A) to (E), a circuit board 10 like that shown in FIG. 1E is formed. This circuit board 10 has a highly accurate electrical circuit 6 formed on the insulating substrate 1, and suppresses the occurrence of short circuits and electromigration.

The materials used in the respective steps are described below.

[Insulating Substrate]

The insulating substrate 1 is not particularly limited, provided it is one that is capable of being used in the production of circuit boards. Examples include resin-containing resin substrates.

Various types of organic substrates capable of being used in the production of circuit boards, such as multilayer circuit boards, may be used without particular limitation as the resin substrate. Illustrative examples of organic substrates include substrates made of epoxy resins, acrylic resins, polycarbonate resins, polyimide resins, polyphenylene sulfide resins, polyphenylene ether resins, cyanate resins, benzoxazine resins or bismaleimide resins that have hitherto been used in the production of multilayer circuit boards.

The epoxy resins are not particularly limited, provided they are epoxy resins which make up various types of organic substrates capable of being used in the production of circuit boards. Illustrative examples include bisphenol A-type epoxy resins, bisphenol F-type epoxy resins, bisphenol S-type epoxy resins, aralkyl epoxy resins, phenol-novolak-type epoxy resins, alkylphenol-novolak-type epoxy resins, biphenol-type epoxy resins, naphthalene-type epoxy resins, dicyclopentadiene-type epoxy resins, epoxidized condensation products of phenols with aromatic aldehydes having a phenolic hydroxyl group, triglycidyl isocyanurates and alicyclic epoxy resins. Further examples, for conferring fire retardance, include brominated or phosphorus-modified epoxy resins, nitrogen-containing resins and silicon-containing resins. These resins may be used singly or two or more may be used in combination.

In cases where the substrate is formed of such resins, a curing agent is generally included in order to induce curing. No particular limitation is imposed on compounds that may be used as the curing agent. Illustrative examples include dicyandiamides, phenolic curing agents, acid anhydride-type curing agents, aminotriazine novolak-type curing agents and cyanate resins. Illustrative examples of phenolic curing agents include novolak-type, aralkyl-type and terpene-type phenolic curing agents. Examples of curing agents for conferring fire retardance include phosphorus-modified phenolic resins and phosphorus-modified cyanate resins. These curing agents may be used singly or two or more may be used in combination.

Moreover, although not particularly limited, in the circuit-forming step (B), because the circuit pattern is formed by laser processing, it is preferable to use, for example, a resin having a high laser light absorptance in the wavelength region of, for example, 100 to 400 nm. Such resins are exemplified by polyimide resins.

A filler may be included in the insulating substrate 1. The filler is not particularly limited, and may be either fine inorganic particles or fine organic particles. When a filler is included, the filler becomes exposed in laser-processed areas and, owing to the unevenness of the exposed filler, the degree of adhesion between the plating and the resin increases.

The material for the fine inorganic particles is exemplified by high dielectric constant (high-k) fillers such as aluminum oxide ($Al_2O_3$), magnesium oxide (MgO), boron nitride (BN), aluminum nitride (AlN), silica ($SiO_2$), barium titanate ($BaTiO_3$) and titanium oxide ($TiO_2$); magnetic fillers such as hard ferrite; inorganic fire retardants such as magnesium hydroxide ($Mg(OH)_2$), aluminum hydroxide ($Al(OH)_2$), antimony trioxide ($Sb_2O_3$), antimony pentoxide ($Sb_2O_5$), guanidine salts, zinc borate, molybdenum compounds and zinc stannate; and also talc ($Mg_3(Si_4O_{10})(OH)_2$), barium sulfate ($BaSO_4$), calcium carbonate ($CaCO_3$) and mica. These types of fine inorganic particles may be used alone or two or more types may be used in combination. Because these fine inorganic particles have a high thermal conductivity, specific dielectric constant, fire retardance, particle size distribution and color tone degree of freedom, in cases where a desired functionality is to be selectively exhibited, higher loading can easily be achieved by suitably carrying out formulation and particle size design. Moreover, although no particular limitation is imposed, it is preferable to use a filler having an average particle diameter which is no larger than the thickness of the dielectric substrate 1; that is, it is desirable to use a filler having an average particle diameter of preferably from 0.01 to 10 μm, and more preferably from 0.05 to 5 μm.

To increase the dispersibility of fine inorganic particles in the insulating substrate 1, the fine inorganic particles may be surface treated with a silane coupling agent, or a silane coupling agent may be included within the insulating substrate 1. The silane coupling agent is exemplified by, but not particularly limited to, epoxysilane, mercaptosilane, aminosilane, vinylsilane, styrylsilane, methacryloxysilane, acryloxysilane and titanate-type silane coupling agents. These silane coupling agents may be used singly or two or more may be used in combination.

In order to increase the dispersibility of fine inorganic particles within the insulating substrate 1, a dispersant may be included within the insulating substrate 1. The dispersant is exemplified by, but not particularly limited to, alkyl ether, sorbitan ester, alkyl polyether amine and polymer-type dispersants. These dispersants may be used singly or two or more may be used in combination.

[Resin Film]

The resin film 2 is a resist for enabling the plating catalyst 5 or a precursor thereof to be deposited and left behind only in laser processed areas. The resin film 2 is not subject to any particular limitation, provided it is not removed in the catalyst deposition step (C) and is removable in the film removing step (D). Illustrative examples include soluble resins that can easily be dissolved by an organic solvent or an alkali solution, and swellable resin films formed of a resin that can be swelled in the subsequently described swelling solution (e.g., an alkaline solution used in the film removing step). Of these, from the standpoint of ease of accurate removal, a swellable resin film is especially preferred. It is preferable for the swellable resin film to have a degree of swelling in a swelling solution of at least 50%. Here, "swellable resin film" encompasses not only resin films which substantially do not dissolve in a swelling solution and easily strip from the surface of the insulating substrate 1 by swelling, but also resin films which swell in a swelling solution, with at least a portion thereof moreover dissolving, and which easily strip from the surface of the insulating substrate 1 by such swelling and dissolution, and additionally resin films which dissolve in a swelling solution and easily strip from the surface of the insulating substrate 1 by such dissolution.

The degree of swelling is calculated by the following formula.

$$\text{Degree of swelling (\%)} = \{(Wa-Wb)/Wb\} \times 100$$

In the formula, Wa is the weight of the resin film after swelling, and Wb is the weight of the resin film before swelling.

The method of forming the resin film 2 is not particularly limited. Examples include the method of applying a liquid material (resin solution) capable of forming a resin film to the surface of the insulating substrate 1 and then drying, and the method of transferring to the surface of the insulating substrate 1 a resin film formed by applying a liquid material (resin solution) capable of forming a resin film to a supporting substrate and then drying. The method of application of the liquid material is not particularly limited. Examples include known spin coating methods and bar coater methods.

The resin film 2 has a thickness of preferably not more than 10 μm, more preferably not more than 5 μm, and even more preferably not more than 3 μm. The thickness of the resin film 2 is preferably at least 0.1 μm, more preferably at least 0.5 μm, and even more preferably at least 1 μm. If the resin film 2 is too thick, the precision of the circuit pattern of circuit grooves 3, through-holes 4 and the like that is formed by laser processing in the circuit forming step (B) has a tendency to decrease. If the resin film 2 is too thin, forming a resin film 2 having a uniform thickness tends to be difficult. Moreover, there is a possibility that the resin film 2 at the periphery of the circuit pattern of circuit grooves 3, though-holes 4 and the like that is formed by laser processing in the circuit forming step (B) will be stripped off, leading to the formation of plating in unnecessary areas (this is connected to the subsequently described problem of "exposure").

As noted above, a resin film having a swellability in a swelling solution of at least 50% may be preferably used as the swellable resin film. A resin film having a swellability in a swelling solution of 100% or more is more preferred. In cases where the swellability is too low, the swellable resin film tends to be difficult to strip off in the film removing step (D).

The method of forming the swellable resin film is not particularly limited, provided it is a method similar to the method of forming the above-described resin film 2. Illustrative examples include the method of applying a liquid material capable of forming a swellable resin film to the surface of an insulating substrate 1 by spin coating or with a bar coater and then drying, and the method of transferring to the surface of the insulating substrate 1 a swellable resin film formed by applying a liquid material capable of forming a resin film to a supporting substrate and then drying.

The liquid material which is capable of forming a swellable resin film is exemplified by suspensions and emulsions of elastomers. Specific examples of elastomers include diene-type elastomers such as styrene-butadiene copolymers, acrylic-type elastomers such as acrylate copolymers, and polyester-type elastomers. With such elastomers, a swellable resin film having the desired degree of swelling can easily be formed by adjusting the degree of crosslinking or the degree of gelation of elastomer resin particles dispersed as a suspension or an emulsion.

The swellable resin film is preferably a film whose degree of swelling changes with the pH of the swelling solution. When such a film is used, by making the liquid conditions in the catalyst deposition step (C) and the liquid conditions in the film removing step (D) dissimilar, it is possible to have the swellable resin film substantially not swell (here, "substantially not swell" means to not swell to a degree that dissolution and stripping occur; when the pH in the catalyst deposition step (C) is acidic, it means to be have acid resistance) and maintain a high adhesive strength to the insulating substrate 1 at the pH in the catalyst deposition step (C), and to have the swellable resin film swell or dissolve and thus easily strip from the insulating substrate 1 at the pH in the film removing step (D).

More specifically, in a case where the catalyst deposition step (C) includes treatment in an acidic plating catalyst colloidal solution (acidic catalyst metal colloidal solution) within a pH range of 1 to 3, and the film removing step (D) includes swelling the swellable resin film in an alkaline solution within a pH range of 12 to 14, it is desirable for the swellable resin film to be a resin film having a swellability in the acidic plating catalyst colloidal solution of preferably 60% or less, more preferably 50% or less, and even more preferably 40% or less (i.e., exhibiting acid resistance), and having a swellability in an alkaline solution of preferably at least 50%, more preferably at least 100%, and even more preferably at least 500% (i.e., exhibiting alkali strippability). However, this is predicated on the swellability of the swellable resin film in an acidic plating catalyst colloidal solution being smaller than its swellability in an alkaline solution.

Such swellable resin films are exemplified by sheets formed from elastomers having a certain amount of carboxyl groups, sheets obtained by the full-surface curing of photocurable alkali-developable resists used in, for example, dry film resists (sometimes abbreviated below as "DFR") for patterning printed circuit boards, and heat-curable, alkali-developable sheets.

Illustrative examples of elastomers having carboxyl groups include styrene-butadiene copolymers and other diene-type elastomers which, by including carboxyl group-containing monomer units as copolymer components, have carboxyl groups on the molecule; acrylic-type elastomers such as acrylate copolymers; and polyester-type elastomers. With such an elastomer, a swellable resin film having the desired alkali swellability can be formed by adjusting, for example, the acid equivalent weight, degree of crosslinking or degree of gelation of the elastomer dispersed as a suspension or emulsion. The carboxyl groups in the elastomer cause the swellable resin film to swell in an alkaline aqueous solution, and act so as to strip the swellable resin film from the surface of the insulating substrate. Here, "acid equivalent weight" refers to the molecular weight of the polymer per carboxyl group.

Specific examples of monomer units having carboxyl groups include (meth)acrylic acid, fumaric acid, cinnamic acid, crotonic acid, itaconic acid and maleic anhydride.

The proportion of carboxyl groups included in such elastomers having carboxyl groups, expressed as the acid equivalent weight, is preferably from 100 to 2,000, and more preferably from 100 to 800. In cases where the acid equivalent weight is too small (the number of carboxyl groups is relatively high), the compatibility with solvents or other compositions decreases, as a result of which the resistance to plating pretreatment solutions tends to decrease. On the other hand, in cases where the acid equivalent weight is too large (the number of carboxyl groups is relatively small), the strippability in alkaline aqueous solutions tends to decrease.

The weight-average molecular weight of the elastomer is preferably from 5,000 to 1,000,000, more preferably from 10,000 to 1,000,000, and even more preferably from 20,000 to 60,000. If the molecular weight of the elastomer is too large, the strippability tends to decrease. On the other hand, if it is too small, the viscosity decreases, making it difficult to maintain a uniform swellable resin film thickness, in addition to which the resistance of the resin film to plating pretreatment solutions tends to worsen.

The resin film may be made of, for example, a polymer resin obtained by polymerizing (a) at least one type of carboxylic acid or acid anhydride monomer having at least one polymerizable unsaturated group on the molecule, and (b) at least one type of monomer which is polymerizable with monomer (a), or a resin composition containing such a polymer resin.

An essential ingredient of the resin composition is the polymer resin which serves as the main resin; in addition, at least one type of oligomer, monomer, filler or other additive may be included. It is desirable for the main resin to be a linear polymer having thermoplastic properties. The polymer is sometimes grafted and branched to control the flow properties, crystallinity and the like. The weight-average molecular weight is from about 1,000 to about 500,000, and preferably from 5,000 to 50,000. If the molecular weight is too low, the film flexibility and plating nucleation solution resistance (acid resistance) tend to decrease. On the other hand, if the molecular weight is too high, the alkali strippability and the attachability when rendered into a dry film tend to worsen. In addition, crosslink points may be introduced to improve plating nucleation solution resistance and to suppress thermal deformation and control flow during laser processing.

The above polymer resin serving as the main resin can be obtained, as described above, by polymerizing (a) a carboxylic acid or acid anhydride monomer having at least one polymerizable unsaturated group on the molecule, and (b) a monomer which is polymerizable with monomer (a). Examples from the known art include those described in Japanese Patent Application Laid-open Nos. H7-281437, 2000-231190 and 2001-201851.

Examples of (a) include (meth)acrylic acid, fumaric acid, cinnamic acid, crotonic acid, itaconic acid, maleic anhydride, maleic half esters and butyl acrylate. These may be used singly or two or more may be used in combination.

Monomer (b) is generally exemplified by, but not limited to, monomers which are non-acidic and have one polymerizable unsaturated group on the molecule. This is selected so as to possess various properties, such as resistance in the plating step and flexibility of the cured film. Illustrative examples include methyl (meth)acrylate, ethyl (meth)acrylate, iso-propyl (meth)acrylate, n-butyl (meth)acrylate, sec-butyl (meth) acrylate, tert-butyl (meth)acrylate, 2-hydroxyethyl (meth) acrylate and 2-hydroxypropyl (meth)acrylate. Additional examples include vinyl alcohol esters such as vinyl acetate, (meth)acrylonitrile, styrene and polymerizable styrene derivatives. Alternatively, the polymer resin can be obtained by polymerizing only the above-described carboxylic acid or acid anhydride having one polymerizable unsaturated group on the molecule. In addition, to enable three-dimensional crosslinking, monomers having a plurality of unsaturated groups may be selected as the monomers used in the polymer, and reactive functional groups such as epoxy groups, hydroxyl groups, amino groups, amide groups and vinyl groups may be introduced onto the molecular skeleton. The amount of carboxyl groups included in the resin, expressed in terms of the acid equivalent weight, is preferably from 100 to 2,000, and more preferably from 100 to 800. If the acid equivalent weight is too low, there is a tendency for the compatibility with solvents or other compositions to decrease and for the resistance to plating pretreatment solutions to decrease. On the other hand, if the acid equivalent weight is too high, there is a tendency for the strippability to decrease. The content of monomer (a) is from 5 to 70 mass %.

The monomer and oligomer may be any that has plating nucleation solution resistance and can easily be removed with an alkali. The plasticizer-like use of these as adhesion imparting agents for enhancing the attachability of the dry film (DFR) is also conceivable. In addition, a crosslinking agent for increasing various resistance properties is added. Specific examples include methyl (meth)acrylate, ethyl (meth)acrylate, iso-propyl (meth)acrylate, n-butyl (meth)acrylate, sec-butyl (meth)acrylate, tert-butyl (meth)acrylate, 2-hydroxyethyl (meth)acrylate and 2-hydroxypropyl (meth)acrylate. Additional examples include vinyl alcohol esters such as vinyl acetate, (meth)acrylonitrile, styrene and polymerizable styrene derivatives. Alternatively, the polymer resin can be obtained by polymerizing only the above-described carboxylic acid or acid anhydride having one polymerizable unsaturated group on the molecule. In addition, a polyfunctional unsaturated compound may be included. Use may be made of either the above monomers or oligomers obtained by reacting such monomers. Aside from the above monomers, two or more other photopolymerizable monomers may be included. Illustrative examples of the monomers include polyoxyalkylene glycol di(meth)acrylates such as 1,6-hexanediol di(meth)acrylate, 1,4-cyclohexanediol di(meth)acrylate, polypropylene glycol di(meth)acrylate, polyethylene glycol di(meth)acrylate and polyoxyethylene polyoxypropylene glycol di(meth)acrylate; 2-di(p-hydroxyphenyl)propane di(meth)acrylate, glycerol tri(meth)acrylate, dipentaerythritol penta(meth)acrylate, trimethylolpropane triglycidyl ether tri(meth)acrylate, bisphenol A diglycidyl ether tri(meth)acrylate, 2,2-bis(4-methacryloxypentaethoxyphenyl)propane, and polyfunctional (meth)acrylates having urethane groups. Use may be made of either the above monomers or oligomers obtained by reacting such monomers.

In addition, a filler may be included. Examples of the filler include, but are not particularly limited to, silica, aluminum hydroxide, magnesium hydroxide, calcium carbonate, clay, kaolin, titanium oxide, barium sulfate, alumina, zinc oxide, talc, mica, glass, potassium titanate, wollastonite, magnesium sulfate, aluminum borate and organic fillers. Because the resin film generally has a small thickness of from 1 to 10 μm, it is preferable for the size of the filler to be small as well. The use of a filler which has a small average particle diameter and from which coarse particles have been excluded is desirable, although it is also possible to eliminate coarse particles by crushing them during dispersion or by filtration.

Examples of other additives include photopolymerizable resins (photopolymerization initiators), polymerization inhibitors, colorants (dyes, pigments, color-forming pigments), thermal polymerization initiators, and crosslinking agents for epoxies, urethanes and the like.

The DFR may be a sheet of photocurable resin composition which includes, as the resin component, an acrylic, epoxy, styrene, phenolic, urethane or other resin containing a given amount of carboxyl groups, and which also includes a photopolymerization initiator. Examples of such DFRs include sheets obtained by the full-surface curing of dry films of the photopolymerizable resin compositions disclosed in Japanese Patent Application Laid-open Nos. 2000-231190, 2001-201851 and H11-212262; and products commercially available as alkali-developable DFRs, such as the UFG series from Asahi Kasei Corporation.

In addition, examples of other swellable resin films include carboxyl group-containing resins which are composed primarily of rosin (e.g., "NAZDAR229" from Yoshikawa Chemical Co., Ltd.), and resins composed primarily of phenol (e.g., "104F" from Lektrachem Ltd.).

The swellable resin film can be easily formed by a method that involves using a coating technique known to the art, such as spin coating or a bar coater method, to apply a suspension or emulsion of the resin to the surface of the insulating substrate, then drying; or by attaching a DFR that has been formed on a supporting substrate to the surface of the insulating substrate using a vacuum laminator or the like, then full-surface curing.

In addition to those mentioned above, other examples of the resist material making up the above resin film include the following.

The properties required of the resist material making up the resin film include, for example: (1) in the subsequently described catalyst deposition step, a high resistance to the solution (plating nucleation solution) in which the insulating substrate on which the resin film has been formed is immersed; (2) ability to easily remove the resin film (resist) by the subsequently described film removing step, such as a step in which the insulating substrate on which the resin film has been formed is immersed in an alkali; (3) high film formability; (4) easy dry film (DFR) formation; and (5) high storage stability.

In cases where the plating nucleation solution is, as subsequently described, an acidic Pd—Sn colloid catalyst system, for example, this is an entirely acidic (pH 1 to 2) aqueous solution. In cases where it is an alkaline Pd ion catalyst system, the catalyst-imparting activator is a weak alkali (pH 8 to 12) and the balance of the solution is acidic. From the above, the resistance to plating nucleation solutions must be capable of enduring a pH of from 1 to 11, and preferably a pH of from 1 to 12. Here, "capable of enduring" means that when a sample on which a film of the resist has been formed is dipped in the solution, swelling and dissolution of the resist is sufficiently suppressed, allowing the film to carry out its role as a resist. In general, the dipping temperature is from room temperature to 60° C., the dipping time is from 1 to 10 minutes, and the resist film thickness is from about 1 to about 10 μm, although the dipping conditions are not limited to these.

The alkali stripping solution used in the film removing step, as subsequently described, is generally an aqueous NaOH solution or an aqueous sodium carbonate solution. It is desirable for the resist film to be easily strippable at a pH of from 11 to 14, and preferably at a pH of from 12 to 14. Dipping or spraying treatment is generally carried out at an aqueous NaOH solution concentration of from about 1 to about 10%, a treatment temperature of from room temperature to 50° C. and a treatment time of from 1 to 10 minutes, although the conditions are not limited to these.

Film formability is also important for forming a resist on an insulating material. Uniform film formability without cissing or the like is essential. A dry film is formed in order to simplify the production process and reduce material loss, although film flex is essential for ensuring good handleability. The resist that has been rendered into a dry film on the insulating material is attached with a laminator (roller, vacuum).

The attaching temperature is from room temperature to 160° C.; any suitable conditions may be used as the attaching pressure and time. Hence, adhesiveness is required at the time of attachment. To this end, in order also to prevent foreign matter from adhering, it is common, though not essential, to adopt a three-layer construction in which the resist that has been rendered into a dry film is sandwiched between a carrier film and a cover film.

The storage stability is most preferably such as to enable storage at room temperature, although the ability for storage under refrigerated conditions is essential. It is critical that the dry film undergo no separation of components, no loss of flexibility, and no cracking under such low-temperature conditions.

The resin composition of the resist material includes a main resin (binder resin) as the essential ingredient, to which may be added at least one type of oligomer, monomer, filler or other additive.

The main resin is preferably a linear polymer having thermoplastic properties. The polymer is sometimes grafted and branched to control the flow properties, crystallinity and the like. The weight-average molecular weight is from about 1,000 to about 500,000, and preferably from 5,000 to 50,000. If the molecular weight is too low, the film flexibility and plating nucleation solution resistance (acid resistance) tend to decrease. On the other hand, if the molecular weight is too high, the alkali strippability and the attachability when rendered into a dry film tend to worsen. In addition, crosslink points may be introduced to improve plating nucleation solution resistance and to suppress thermal deformation and control flow during laser processing.

The main resin can be obtained by polymerizing (a) a carboxylic acid or acid anhydride monomer having at least one polymerizable unsaturated group on the molecule, and (b) a monomer which is polymerizable with monomer (a). Examples from the known art include those described in Japanese Patent Application Laid-open Nos. H7-281437, 2000-231190 and 2001-201851. Examples of (a) include (meth)acrylic acid, fumaric acid, cinnamic acid, crotonic acid, itaconic acid, maleic anhydride, maleic half esters and butyl acrylate. These may be used singly or two or more may be used in combination. Monomer (b) is generally, though not necessarily, a monomer which is non-acidic and has one polymerizable unsaturated group on the molecule. This is selected so as to possess various properties, such as resistance in the plating step and flexibility of the cured film. Illustrative examples include methyl (meth)acrylate, ethyl (meth)acrylate, iso-propyl (meth)acrylate, n-butyl (meth)acrylate, sec-butyl (meth)acrylate, tert-butyl (meth)acrylate, 2-hydroxyethyl (meth)acrylate and 2-hydroxypropyl (meth)acrylate. Additional examples include vinyl alcohol esters such as vinyl acetate, (meth)acrylonitrile, styrene and polymerizable styrene derivatives. Alternatively, the resin can be obtained by polymerizing only the above-described carboxylic acids or acid anhydrides having one polymerizable unsaturated group on the molecule. In addition, to enable three-dimensional crosslinking, monomers having a plurality of unsaturated groups may be selected as the monomers used in the polymer, and reactive functional groups such as epoxy groups, hydroxyl groups, amino groups, amide groups and vinyl groups may be introduced onto the molecular skeleton. When carboxyl groups are included in the resin, the amount of carboxyl groups included in the resin, expressed in terms of the acid equivalent weight, is preferably from 100 to 2,000, and more preferably from 100 to 800. If the acid equivalent weight is too low, there is a tendency for the compatibility with solvents or other compositions to decrease and for the resistance to plating pretreatment solutions to decrease. On the other hand, if the acid equivalent weight is too high, there is a tendency for the strippability to decrease. The content of monomer (a) is from 5 to 70 mass %.

The monomer and oligomer may be any that has plating nucleation solution resistance and can easily be removed with an alkali. The plasticizer-like use of these as adhesion imparting agents for enhancing the attachability of the dry film (DFR) is also conceivable. In addition, a crosslinking agent for increasing various resistance properties is added. Specific examples include methyl (meth)acrylate, ethyl (meth)acrylate, iso-propyl (meth)acrylate, n-butyl (meth)acrylate, sec-butyl (meth)acrylate, tert-butyl (meth)acrylate, 2-hydroxyethyl (meth)acrylate and 2-hydroxypropyl (meth)acrylate. Additional examples include vinyl alcohol esters such as vinyl acetate, (meth)acrylonitrile, styrene and polymerizable styrene derivatives. Alternatively, the resin can be obtained by polymerizing only the above-described carboxylic acids or acid anhydrides having one polymerizable unsaturated group on the molecule. In addition, a polyfunctional unsaturated compound may be included. Use may be made of either the above monomers or oligomers obtained by reacting such monomers. Aside from the above monomers, two or more other photopolymerizable monomers may be included. Illustrative examples of the monomers include polyoxyalkylene glycol di(meth)acrylates such as 1,6-hexanediol di(meth)acrylate, 1,4-cyclohexanediol di(meth)acrylate, polypropylene glycol di(meth)acrylate, polyethylene glycol di(meth)acrylate and polyoxyethylene polyoxypropylene glycol di(meth)acrylate; 2-di(p-hydroxyphenyl)propane di(meth)acrylate, glycerol tri(meth)acrylate, dipentaerythritol penta (meth)acrylate, trimethylolpropane triglycidyl ether tri (meth)acrylate, bisphenol A diglycidyl ether tri(meth)acrylate, 2,2-bis(4-methacryloxypentaethoxyphenyl) propane, and polyfunctional (meth)acrylates having urethane groups. Use may be made of either the above monomers or oligomers obtained by reacting such monomers.

In addition, a filler may be included. Examples of the filler include, but are not particularly limited to, silica, aluminum hydroxide, magnesium hydroxide, calcium carbonate, clay, kaolin, titanium oxide, barium sulfate, alumina, zinc oxide, talc, mica, glass, potassium titanate, wollastonite, magnesium sulfate, aluminum borate and organic fillers. Because the resist generally has a small thickness of from 1 to 10 μm, it is preferable for the size of the filler to be small as well. The use of filler which has a small average particle diameter and from which coarse particles have been excluded is desirable, although it is also possible to eliminate coarse particles by crushing them during dispersion or by filtration.

Examples of other additives include photopolymerizable resins (photopolymerization initiators), polymerization inhibitors, colorants (dyes, pigments, color-forming pigments), thermal polymerization initiators, and crosslinking agents for epoxies, urethanes and the like.

In the printed circuit board production method of the present invention, there are times where, for example, laser processing is used. When laser processing is to be used, it is essential to impart the resist material with laser ablation properties. A carbon dioxide gas laser, an excimer laser, a UV-YAG laser or the like may be selected as the laser processing system. These laser processing systems each have characteristic wavelengths. By having the material be one which has a high absorptance at that wavelength, the productivity can be improved. Of the above types of lasers, a UV-YAG laser is highly suitable for microfabrication; because the fundamental wavelength of the laser light is 1064 nm, the third harmonic wavelength is 355 nm and the fourth harmonic wavelength is 266 nm, it is desirable for the resist material to have high absorptances at these wavelengths. On the other hand, there are also cases in which a material having a somewhat low absorptance is preferred. Specifically, when a resist having a low UV absorptance is used, UV light passes through the resist, and so energy can be concentrated in the processing of the underlying insulating layer. That is, because the advantages differ depending on the absorptance of laser light, it is preferable to use a resist in which the laser light absorptance of the resist is adjusted according to the conditions.

[Characteristics and Advantageous Effects of the Embodiment]

Hence, this embodiment uses a resin composition which includes a copolymer consisting of (i) a monomer containing monomer units having at least one carboxyl group and (ii) a monomer copolymerizable with monomer (i), and includes also an ultraviolet absorber. In this case, use is made of a resin composition for which, when $\in 1$ represents the absorbance coefficient per unit weight (1 g/L) of resin film 2 in a solution prepared by dissolving in a solvent (e.g., methanol) a resin film 2 formed by application of the resin composition as a liquid, $\in 1$ at the wavelength (e.g., 266 nm or 355 nm) of light (laser light) with which the resin film 2 is to be irradiated is at least 0.01 (L/(g·cm)). A resin film 2 having a high absorptance at the characteristic wavelengths of the laser light can thereby be obtained. Moreover, the laser processability increases, enabling the productivity of the circuit board 10 to be improved.

In view of, for example, the problem of "residues," better results are obtained when the absorbance coefficient $\in 1$ is at least 0.1 (L/(g·cm)), and especially at least 1.0 (L/(g·cm)). From the standpoint of, for example, the subsequently described problem of "exposure," the absorbance coefficient $\in 1$ is more preferably not more than 10 (L/(g·cm)).

In the present embodiment, the absorbance coefficient $\in 1$ can, for example, be obtained in the following manner. In the explanation that follows, 355 nm is used by way of illustration as the wavelength of the light which irradiates the resin film 2. The resin film that has been formed by applying the resin composition as a liquid is dissolved in, for example, methanol, thereby preparing a methanol solution of the resin film (concentration, 0.40 g/L). The absorption spectrum of the prepared methanol solution is measured over a wavelength range of, for example, 200 to 600 nm using an ultraviolet-visible light spectrophotometer. The absorbance coefficient $\in 1$ at 355 nm is calculated from the formula shown below based on the spectral data thus obtained (absorbance A). The absorbance coefficient $\in 1$ corresponds to the absorbance measured after filling a cell having a cell length d of 1 cm with a solution having a solution concentration c of 1 g/L.

$$\text{Absorbance } A \text{ at 355 nm} = \in 1 \text{ (L/(g·cm))} \times c(\text{g/L: concentration of solution}) \times d(\text{cm: cell length}) \quad \text{[Formula]}$$

In this embodiment, the wavelength of the laser light that irradiates the resin film 2 in the circuit forming step is 266 nm or 355 nm. The ultraviolet absorber has an absorption wavelength of, for example, at least 250 to 400 nm, and preferably at least 300 to 400 nm. It is possible in this way to obtain a resin film 2 having a high laser absorptance using a fourth harmonic UV-YAG laser or a third harmonic UV-YAG laser.

In this embodiment, the ultraviolet absorber is at least one selected from the group consisting of, for example, benzotriazole derivatives, benzophenone derivatives, benzoate derivatives, triazine derivatives, benzothiazole derivatives and benzoyl methane. These are compounds having a structure with a conjugated system equivalent to or more extensive than benzene and containing an aromatic ring and a heteroatom. By including such an ultraviolet absorber in the resin film 2, regardless of the thickness of the resin film 2 (e.g., even if the resin film 2 has a large thickness such as 5 μm), the laser light absorptance of the resin film 2 in the laser processing wavelength region during laser processing increases, enhancing the laser processability. As a result, resin film residues in the processed areas following laser processing are minimized and undesirable effects such as bulging of the resin film and obstruction of the circuit pattern are suppressed. Good circuit formation by plating that is ultimately selective is thus possible, enabling a highly accurate electrical circuit to be formed on the insulating substrate and in turn making it possible to obtain a circuit board 10 in which the occurrence of short circuits and electromigration has been suppressed.

With regard to bulging of the resin film 2, in this embodiment, when the resin film 2 is laser processed at a laser light wavelength used in laser processing (e.g., 355 nm or 266 nm etc.), and circuit grooves 3 and through-holes 4 are formed, it is preferable for the resin film to possess the processing characteristic that the resin film has, peripheral to the laser processed area, a thickness after laser processing which is not more than twice the thickness before laser processing. This suppresses bulging, results in good deposition of the plating catalyst 5 in recessed portions of the circuit pattern, and ultimately leads to good formation of the target electrical circuit, suppressing a decline in the productivity of the circuit board 10. More specifically, in the circuit forming step shown in FIG. 1B, for instance, when recessed portions 3 and 4 having a depth, with reference to an outer surface of the resin film 2, which exceeds the thickness of the resin film 2 are formed by laser processing, that is, in cases where the recessed portions 3 and 4 also extend into insulating substrate 1, it is preferable for the resin film 2 to possess the processing characteristic that the resin film 2 has, peripheral to the laser processed area, a thickness after laser processing which is not more than twice the thickness before laser processing.

In this embodiment, the content of the ultraviolet absorber is preferably from 0.1 to 60 mass % relative to the copolymer. By setting the content of ultraviolet absorber to at least 0.1 mass %, a sufficient improvement in laser light absorptance by the resin film 2 can be achieved. By setting the content of ultraviolet absorber to not more than 60 mass %, the problem of "exposure" (which is subsequently described) caused by the laser light absorptance of the resin film 2 becoming too large is suppressed.

From the standpoint of, for example, the problem of "residues," the content of the ultraviolet absorber with respect to the copolymer is more preferably at least 1 mass %, and even more preferably at least 5 mass %.

In this embodiment, the ultraviolet absorber used may be, for example, the benzotriazole-type products which are commercially available as the TINUVIN series. These ultraviolet absorbers have an absorption region which, in accordance with the substituents and the extensiveness of the conjugated system, includes at least 250 to 400 nm, or at least 300 to 400 nm; hence, a wavelength region that includes the YAG laser processing system laser wavelength 266 nm or 355 nm is used as the absorption wavelength. Illustrative examples include TINUVIN P ($\lambda_{max}$ (absorption maximum), 340 nm), TINUVIN 234 ($\lambda_{max}$ (absorption maximum), 346 nm), TINUVIN 326 ($\lambda_{max}$ (absorption maximum), 353 nm), TINUVIN 329 ($\lambda_{max}$ (absorption maximum), 340 nm), TINUVIN 213 ($\lambda_{max}$ (absorption maximum), 343 nm), and TINUVIN 571 ($\lambda_{max}$ (absorption maximum), 344 nm). In addition, TINUVIN 571 (2-(5-methyl-2-hydroxy-3-dodecylphenyl (branched or linear)) benzotriazole) is a liquid, and thus, in this embodiment, is preferred in terms of handleability.

Moreover, in this embodiment, use may be made of the benzophenone-type ultraviolet absorbers which are commercially available as, for example, CHIMASSORB 81. These ultraviolet absorbers also have an absorption region which, in accordance with the substituents and the extensiveness of the conjugated system, includes at least 250 to 400 nm, or at least 300 to 400 nm; hence, a wavelength region that includes the YAG laser processing system laser wavelength 266 nm or 355 nm is used as the absorption wavelength.

Also, in this embodiment, use may be made of the benzoate-type ultraviolet absorbers which are commercially available as, for example, TINUVIN 120. These ultraviolet absorbers also have an absorption region which, in accordance with the substituents and the extensiveness of the conjugated system, includes at least 250 to 400 nm, or at least 300 to 400 nm; hence, a wavelength region that includes the YAG laser processing system laser wavelength 266 nm or 355 nm is used as the absorption wavelength.

Furthermore, in this embodiment, use may be made of the triazine-type ultraviolet absorbers which are commercially available as, for example, TINUVIN 1577. These ultraviolet absorbers also have an absorption region which, in accordance with the substituents and the extensiveness of the conjugated system, includes at least 250 to 400 nm, or at least 300 to 400 nm; hence, a wavelength region that includes the YAG laser processing system laser wavelength 266 nm or 355 nm is used as the absorption wavelength.

In this embodiment, by using these ultraviolet absorbers, either singly or as combinations of two or more thereof, it is possible to obtain a resin composition and, in turn, a resist material having a high absorptance at wavelengths at least in the range of 250 to 400 nm, or at wavelengths at least in the range of 300 to 400 nm. As a result, a resin film 2 can be precisely microfabricated using a fourth harmonic UV-YAG laser or a third harmonic UV-YAG laser, both of which have a high frequency of use and a high versatility, enabling circuit formation to be advantageously carried out and highly accurate electrical circuits to be formed at a high productivity on insulating substrates.

As described above, in the resin film forming step of this embodiment, a resin film 2 is formed on the surface of the insulating substrate 1 by applying a liquid material (the resin composition as a liquid) to the surface of the insulating substrate 1, then drying the applied liquid material. Alternatively in the resin film forming step, a resin film 2 is formed on the surface of the insulating substrate 1 by applying a liquid material (the resin composition as a liquid) to a supporting substrate and drying the applied liquid material, then transferring the resin film (dry film) thus formed to the surface of an insulating substrate 1. In the former case where the liquid material is applied onto the insulating substrate 1, it is desirable for the thickness of the resin film to be 1 µm; in the latter case in which the dry film is transferred, it is desirable for the thickness to be from 3 to 5 µm. In the present embodiment, a larger resin film thickness makes formation of the resin film (resist) even easier. Therefore, in this embodiment, the target thickness of the resin film 2 is from 3 to 5 µm. If, on the other hand, the resin film 2 is too thin, because the laser processability becomes better as the laser absorptance by the resin film improves, there is a possibility that not only recessed areas of the circuit pattern but also the resin film around the recessed areas which are intended to form the circuit pattern will also be removed, resulting in exposure of the surface of the insulating substrate 1 below the resin film 2 (the "exposure" problem). In this case, the plating catalyst is deposited also in areas around the circuit pattern (that is, outside the circuit pattern), resulting in the formation of plating at the periphery of the circuit pattern, and thus preventing a smaller linewidth from being achieved in the electrical circuit. This "exposure" problem in the insulating substrate 1 arises not only when the resin film 2 is too thin; it may also arise when too much ultraviolet absorber is included in the resin film 2.

In this embodiment, it is desirable for the resin film 2 to have excellent properties with respect to all of the following: laser processability, acid resistance and alkali strippability. By using an ultraviolet absorber, the resin film 2 can be endowed with a high laser light absorptance, enabling the laser processability to be improved. At this time, it is desirable for the laser processability to be excellent while maintaining the other necessary properties (acid resistance and alkali strippability). It is for this reason that a copolymer consisting of (i) a monomer containing monomer units having at least one carboxyl group and (ii) a monomer copolymerizable with monomer (i) is used as a component of the polymer making up the resin film 2.

In this embodiment, it is presumed that the laser processability of the resin film 2 increases on account of, for example, the high adherence of the resin film 2 to the insulating substrate 1 and the ease with which cleavage of the polymer molecules occurs.

In this embodiment, it is presumed that the acid resistance of the resin film 2 increases on account of, for example, the high adherence of the resin film 2 to the insulating substrate 1 and the presence of acidic functional groups on the polymer.

In this embodiment, it is presumed that the alkaline strippability of the resin film 2 increases on account of, for example, the presence of acidic functional groups on the polymer, the alkali solubility of the polymer, and the presence of bulk functional groups on the polymer.

In light of the above, in this embodiment, the copolymer preferably uses an $\alpha,\beta$-unsaturated carbonyl group-containing monomer as above monomer (i). Moreover, the content of this monomer within the copolymer is set to from 10 to 90 mass %. A monomer which is copolymerizable with monomer (i) and has a polymerizable unsaturated group at a molecular end thereof is preferably used as above monomer (ii). The content of the latter monomer in the copolymer is set to from 10 to 90 mass %. In addition, it is preferable for the copolymer to be a binary or higher copolymer. Copolymers constructed in this way are able to furnish resin films 2 having an excellent laser processability, excellent acid resistance and excellent alkali strippability.

In this embodiment, the $\alpha,\beta$-unsaturated carbonyl group-containing monomer is preferably at least one selected from the group consisting of acrylic acid, methacrylic acid, itaconic acid, fumaric acid, maleic acid and ester compounds thereof. As a result, the laser processability, acid resistance and alkali strippability of the resin film 2 become even better.

In this embodiment, the monomer having a polymerizable unsaturated group at a molecular end is preferably at least one selected from the group consisting of styrene and compounds having diene skeletons. As a result, the laser processability, acid resistance and alkali strippability of the resin film 2 become even better.

In this embodiment, the weight-average molecular weight of the copolymer is preferably from 5,000 to 1,000,000. By setting the weight-average molecular weight of the copolymer to not more than 1,000,000, the good strippability of the resin film 2 is ensured. By setting the weight-average molecular weight of the copolymer to at least 5,000, the good acid resistance of the resin film 2 is ensured.

In this embodiment, it is preferable for the resin film 2 to substantially not swell in an acidic catalyst metal colloidal solution (acidic plating catalyst colloidal solution), and to swell or dissolve in an alkaline solution. Here, as described above, "to substantially not swell" means to not swell to a degree that dissolution or stripping arises. In cases where the pH in the catalyst deposition step (C) is acidic, this means to have acid resistance. Accordingly, in this embodiment, the resin film 2 has acid resistance. The acid resistance and alkali strippability of the resin film 2 are thereby fully manifested. Hence, in the catalyst deposition step, the resin film 2 maintains a high adherence to the insulating substrate 1, and in the film removing step, the resin film 2 is easily removed from the insulating substrate 1.

In this embodiment, it is preferable for the resin film 2 to have a swellability in an acidic catalyst metal colloidal solution (acidic plating catalyst colloidal solution) of not more than 60% and a swellability in an alkaline solution of at least 50%. However, this is predicated on the swellability of the resin film 2 in an acidic catalyst metal colloidal solution being smaller than its swellability in an alkaline solution. As a result, swelling or dissolution of the resin film 2 in an alkaline solution is achieved with substantially no swelling of the resin film 2 in an acidic catalyst metal colloidal solution.

A specific example of the copolymer consisting of monomer (i) and monomer (ii) is an acrylic acid-styrene-alkyl acrylate terpolymer. This copolymer is a random copolymer. The compounding ratio of the three components is exemplified by 15 to 35 mass % of acrylic acid, 45 to 65 mass % of styrene, and 10 to 30 mass % of alkyl acrylate. A more specific example is 25 mass % of acrylic acid, 55 mass % of styrene, and 20 mass % of alkyl acrylate. An example of the alkyl acrylate is 2-ethylhexyl acrylate. Such a copolymer may be stored and used as an organic solvent (e.g., IPA) solution having a solids content of 20%.

In this embodiment, as described above, use is made of a resin composition for which the resin film 2 obtained by applying a resin solution of the ultraviolet absorber-containing resin composition has an absorbance coefficient ∈1 per unit weight of, e.g., a methanol solution (1 g/L) which, at a wavelength such as 355 nm or 266 nm, is at least 0.01 (L(g·cm)). Such a property is one indicator of the resist function. A resin composition exhibiting such a property is capable of furnishing a resin film 2 endowed with a laser processability, acid resistance and alkali strippability which are all excellent.

In this embodiment, it is preferable for the copolymer to have an absorption wavelength which is at least 200 to 300 nm. That is, the copolymer itself inherently has an absorption wavelength which is at least 200 to 300 nm. As a result, a resin film 2 having a high laser absorptance can be obtained using a fourth harmonic UV-YAG laser (laser light wavelength, 266 nm).

The structure that enables the copolymer itself to inherently have an absorption wavelength at least in the range of 200 to 300 nm can be achieved by, for example, the copolymer having an independent benzene ring which is not condensed. This is because an independent benzene ring itself has an absorption wavelength at least in the range of 200 to 300 nm (the $\lambda_{max}$ (absorption maximum) for benzene is 255 nm). The copolymer having an independent benzene ring is exemplified by styrene-type copolymers.

In cases where the copolymer itself has an absorption wavelength at least in the range of 200 to 300 nm, for a resin composition containing an ultraviolet absorber having an absorption wavelength of, for example, at least 250 to 400 nm, whether a third harmonic UV-YAG laser is used or a fourth harmonic UV-YAG laser is used, the laser processability of the resin film 2 is reliably improved, further increasing the productivity of the circuit board 10. Such a resin composition has an expanded versatility, and thus is even more beneficial.

[Circuit Forming Step]

The circuit forming step is a step in which a circuit pattern of circuit grooves 3 and the like is formed in the insulating substrate 1. As described above, the circuit pattern is not limited only to circuit grooves 3 and may include also through-holes 4 and holes for pads.

The method of forming the circuit pattern is not particularly limited. An illustrative example is a method of forming, in the insulating substrate 1 wherein the resin film 2 has been formed, circuit grooves 3 of the desired shape and depth from an outer surface side of the resin film 2 by applying laser processing, a cutting operation such as dicing, or a machining operation such as embossing. In cases where highly precise microcircuits are to be formed, the use of laser processing is preferred. In laser processing, the cutting depth and the like can be adjusted by varying the laser power and other parameters. Embossing operations that may be advantageously used include, for example, embossing with micromolds such as are used in the field of nanoimprint lithography.

In the case of laser processing, UV-YAG lasers are suitable for microfabrication. Advantageous use can be such lasers for which the laser light has a fundamental wavelength of 1064 nm, the third harmonic wavelength is 355 nm, and the fourth harmonic wavelength is 266 nm.

This step defines the shape of the circuit pattern, including the shape and depth of the circuit grooves 3 and the diameter and positions of the through-holes 4. In the circuit forming step, these recessed portions should be extended to a depth that is equal to or greater than the thickness of the resin film 2, it being possible to extend these features to a depth that is exactly the thickness of the resin film 2 or to extend them to a depth greater than the thickness of the resin film 2.

The linewidth of the circuit pattern formed of circuit grooves 3 and the like formed in the circuit forming step is not particularly limited. In cases where laser processing has been used, fine circuits having a linewidth of 20 μm or less can easily be formed. Moreover, in cases where steps between the electrical circuit and the insulating substrate have been eliminated by "fill-up plating," the depth of the circuit grooves becomes the depth of the electrical circuit formed in this embodiment.

[Catalyst Deposition Step]

The catalyst deposition step is a step in which a plating catalyst 5 or a precursor thereof is deposited on the surface of a circuit pattern of the above-described circuit grooves 3 and the like and on the surface of the resin film 2. When through-holes 4 have been formed, the plating catalyst or precursor thereof is deposited on the inner wall surfaces of the through-holes 4 as well.

The plating catalyst 5 or precursor thereof is a catalyst which is furnished in order to form an electroless plating film only on those areas where an electroless plating film is to be formed by electroless plating in the plating treatment step. Any catalyst known for use in electroless plating may be used without particular limitation as the plating catalyst. Alternatively, it is possible to first deposit a plating catalyst precursor and, following removal of the resin film, to form a plating catalyst. Specific examples of the plating catalyst include metallic palladium (Pd), platinum (Pt) and silver (Ag), and also precursors which produce these.

The method for depositing the plating catalyst 5 or a precursor thereof is exemplified by a method involving treatment with an acidic Pd—Sn colloidal solution that is treated under acidic conditions of pH 1 to 3, followed by treatment with an acid solution. A specific example is described below.

First, oils and the like adhering to the surface of the insulating substrate 1 on which circuit grooves 3 and through-holes 4 have been formed are hot water washed for a given period of time in a surfactant solution (cleaner/conditioner). Next, if necessary, soft etching treatment is carried out with a sodium persulfate/sulfuric acid type soft etching agent. Then acid cleaning is carried out in an acidic solution such as a pH 1 to 2 aqueous sulfuric acid solution or aqueous hydrochloric acid solution. Pre-dipping treatment in order to have chloride ions adsorbed onto the surface of the insulating substrate 1 is subsequently carried out by immersion in a pre-dipping solution composed primarily of, for example, an aqueous solution of stannous chloride having a concentration of about 0.1%. Next, the agglomeration and adsorption of Pd and Sn is induced by additional immersion in a stannous chloride and palladium chloride-containing acidic plating catalyst colloidal solution of, for example, a pH 1 to 3 acidic Pd—Sn colloid. Then a redox reaction ($SnCl_2+PdCl_2 \rightarrow SnCl_4+Pd \downarrow$) is effected between the adsorbed stannous chloride and palladium chloride, as a result of which deposition of the metallic palladium as the plating catalyst occurs.

A known acidic Pd—Sn colloid catalyst solution or the like can be used as the acidic plating catalyst colloidal solution. Use may be made of a commercial plating process which uses an acidic plating catalyst colloidal solution. Such processes are prepared as systems and sold by, for example, Rhome and Haas Electronic Materials KK.

A plating catalyst 5 or a precursor thereof can be deposited on the surfaces of the circuit grooves 3, the inner wall surfaces of the through-holes 4, and the surface of the resin film 2 by such a catalyst deposition treatment.

[Film Removing Step]

The film removing step is the step of removing the resin film 2 from the insulating substrate 1 which has been subjected to the catalyst deposition step.

The method of removing the resin film 2 is not particularly limited. Illustrative examples include a method in which the resin film 2 is made to swell in a given solution (swelling solution), following which the resin film 2 is stripped from the insulating substrate 1; a method in which the resin film 2 is made to swell and moreover is partially dissolved in a given solution (swelling solution), following which the resin film 2 is stripped from the insulating substrate 1; and a method in which the resin film 2 is dissolved and removed with a given solution (swelling solution). The swelling solution is not particularly limited, provided it is a liquid capable of causing the resin film 2 to swell. The above swelling or dissolution is carried out by, for example, immersing the resin film 2-coated insulating substrate 1 in the swelling solution for a given period of time. The removal efficiency can be increased by ultrasonic irradiation during immersion. When stripping is carried out after having induced swelling, the film may be peeled out with a light force.

This step is described for a case in which above-described swellable resin film was used as the resin film 2.

The liquid (swelling solution) that causes the swellable resin film 2 to swell is not particularly limited; use may be made of any liquid which can induce the swellable resin film 2 to swell or dissolve while causing substantially no decomposition or dissolution of the insulating substrate 1 and the plating catalyst or precursor thereof 5. A liquid which is capable of inducing swelling to a degree where the swellable resin film 2 readily strips off is preferred. Such a swelling solution may be suitably selected according to the type and thickness of the swellable resin film 2. Specifically, in cases where the swellable resin film is formed of an elastomer such as a diene-type elastomer, an acrylic-type elastomer or a polyester-type elastomer; a polymer resin obtained by polymerizing (a) at least one type of monomer which is a carboxylic acid or an acid anhydride having at least one polymerizable unsaturated group on the molecule and (b) at least one type of monomer which is polymerizable with monomer (a), or a resin composition containing such a polymer resin; and a carboxyl group-containing acrylic resin, preferred use can be made of an alkaline aqueous solution such as an aqueous solution of sodium hydroxide having a concentration of about 1 to about 10%.

In cases where a plating process involving treatment under acidic conditions as described above has been used in the catalyst deposition step, the swellable resin film 2 is preferably formed of an elastomer such as a diene-type elastomer, an acrylic-type elastomer or a polyester-type elastomer; a polymer resin obtained by polymerizing (a) at least one type of monomer which is a carboxylic acid or an acid anhydride having at least one polymerizable unsaturated group on the molecule and (b) at least one type of monomer which is polymerizable with monomer (a), or a resin composition containing such a polymer resin; and a carboxyl group-containing acrylic resin so that the resin film 2 has a swellability under acidic conditions of less than 50%, and preferably not more than 40%, and has a swellability under alkaline conditions of at least 50%. Such a swellable resin film easily swells and strips away with an alkaline aqueous solution of pH 12 to 14, such as an aqueous solution of sodium hydroxide having a concentration of about 1 to about 10%.

The method for swelling the swellable resin film 2 is exemplified by a method in which an insulating substrate 1 coated with a swellable resin film 2 is immersed for a given period of time in a swelling solution. To increase the strippability, it is especially preferable to carry out ultrasonic irradiation during immersion. In cases where the resin film 2 swells only and does not strip off, if necessary, stripping may be carried out by peeling off the film with a small force.

[Plating Treatment Step]

The plating treatment step is a step in which electroless plating treatment is applied to the insulating substrate 1 following removal of the resin film 2.

The electroless plating treatment method employed may be a method wherein an insulating substrate 1 on portions of which a plating catalyst or a precursor thereof 5 has been deposited is immersed in an electroless plating solution so as to induce the deposition of an electroless plating film (plating film) only on those portions where the plating solution or a precursor thereof 5 has been deposited.

Examples of the metal used in electroless plating include copper (Cu), nickel (Ni), cobalt (Co) and aluminum (Al). Of these, plating composed primarily of copper is preferred on account of the excellent electrical conductivity. Also, when nickel is included, this is preferred because of the excellent etching resistance and adherence to solder.

The thickness of the electroless plating film 6, although not particularly limited, is preferably from about 0.1 to about 10 µm, and more preferably from about 1 to about 5 µm. In particular, by making the depth of the circuit grooves 3 large, a thick plating film is obtained, enabling metal interconnections having a large cross-section to be easily formed. This is advantageous because the strength of the metal interconnections can be increased.

By way of the plating treatment step, an electroless plating film deposits only in those portions of the insulating substrate 1 surface where the plating catalyst or a precursor thereof 5 remains. This enables a conductive layer to be properly formed only in those areas where the circuit pattern is to be formed. At the same time, the deposition of an electroless plating film in areas where a circuit pattern is not to be formed can be suppressed. Therefore, even in cases where a plurality of fine circuits having narrow pitch intervals and narrow linewidths are formed, unnecessary plating film does not remain between neighboring circuits. Hence, the occurrence of short circuits and electromigration can be suppressed.

As related above, one aspect of the invention is a resin composition which includes a copolymer that consists of a first monomer containing a monomer unit having at least one carboxyl group and a second monomer copolymerizable with the first monomer, and an ultraviolet absorber, wherein, when ∈1 represents an absorbance coefficient per unit weight of a resin film in a solution prepared by dissolving, in a solvent, the resin film formed by application of the resin composition as a liquid, ∈1 at a wavelength of light at which the resin film is to be irradiated is at least 0.01 (L/(g·cm)).

In the above arrangement, it is preferable for the resin film, when laser processed with laser light having the wavelength at which the resin film is irradiated, to possess a processing characteristic that the resin film has, peripheral to the laser processed area, a thickness after laser processing which is not more than twice the thickness before laser processing.

In the above arrangement, it is preferable for the ultraviolet absorber to be a compound having a structure with a more extensive conjugated system than benzene and containing an aromatic ring and a heteroatom, and to be included in an amount of from 0.1 to 60 mass % relative to the copolymer.

In the above arrangement, it is preferable for the ultraviolet absorber to be at least one selected from the group consisting of benzotriazole derivatives, benzophenone derivatives, benzoate derivatives, triazine derivatives, benzothiazole derivatives and benzoyl methane.

In the above arrangement, it is preferable for the copolymer to be a binary or higher copolymer including from 10 to 90 mass % of an α,β-unsaturated carbonyl group-containing monomer and from 10 to 90 mass % of another monomer which is copolymerizable therewith and has a polymerizable unsaturated group at a molecular end.

In the above arrangement, it is preferable for the α,β-unsaturated carbonyl group-containing monomer to be at least one selected from the group consisting of acrylic acid, methacrylic acid, itaconic acid, fumaric acid, maleic acid and ester compounds thereof.

In the above arrangement, it is preferable for the monomer having a polymerizable unsaturated group at a molecular end to be at least one selected from the group consisting of styrene and diene skeleton-containing compounds.

In the above arrangement, it is preferable for the copolymer to have a weight-average molecular weight of from 5,000 to 1,000,000.

In the above arrangement, it is preferable for the resin film to substantially not swell in an acidic catalyst metal colloidal solution, and to swell or dissolve in an alkaline solution.

In the above arrangement, it is preferable that, provided the degree of swelling of the resin film in an acidic catalyst metal colloidal solution is smaller than the degree of swelling thereof in an alkaline solution, the degree of swelling of the resin film in an acidic catalyst metal colloidal solution be 60% or less and the degree of swelling thereof in an alkaline solution be at least 50%.

In the above arrangement, it is preferable for the resin film to be formed by applying the resin composition as a liquid to a substrate surface, then drying the applied resin composition.

In the above arrangement, it is preferable for the resin film to be formed by applying the resin composition as a liquid to a supporting substrate, then drying the application resin composition to form an initial resin film, and transferring the initial resin film to a substrate surface.

In the above arrangement, it is preferable for the wavelength of light at which the resin film is to be irradiated to be 266 nm or 355 nm, and for the ultraviolet absorber to have an absorption wavelength at least in the range of 250 to 400 nm.

In the above arrangement, it is preferable for the copolymer to have an absorption wavelength at least in the range of 200 to 300 nm.

Another aspect of the invention is a circuit board production method which includes the steps of: forming a resin film on a surface of an insulating substrate using the above resin composition; forming a circuit pattern by using laser processing to form recessed portions having a depth, with reference to an outer surface of the resin film, which is equal to or greater than the thickness of the resin film; depositing a plating catalyst or a precursor thereof on a surface of the circuit pattern and a surface of the resin film; removing the resin film from the insulating substrate; and forming an electroless plating film only in areas where the plating catalyst or precursor thereof remains behind following removal of the resin film.

In the foregoing arrangement, it is preferable, in the circuit pattern forming step, for recessed portions having a depth, with reference to an outside surface of the resin film, which exceeds the thickness of the resin film to be formed by laser processing, and for the resin film to possess the processing characteristic that the resin film has, peripheral to the laser processed area, a thickness after laser processing which is not more than twice the thickness before laser processing.

EXAMPLES

The invention is described more fully below by way of examples. However, the scope of the invention is not to be understood as being limited in any way by the following examples.

First, the insulating substrate was fabricated as follows. That is, a release film (TN100, from Toyobo Co., Ltd.) was placed on the surface of a resin substrate made of a resin composition containing a bisphenol A-type epoxy resin (850S, from DIC Corporation), dicyandiamide as a curing agent (DICY, from Nippon Carbide Industries Co., Inc.), 2-ethyl-4-methylimidazozle as a curing accelerator (2E4MZ, from Shikoku Chemical Corporation), silica as an inorganic filler (FB1SDX, from Denki Kagaku Kogyo KK), and methyl ethyl ketone (MEK) and N,N-dimethylformamide (DMF) as solvents. The resulting assembly was molded under applied heat and pressure, then dried under heating, thereby curing the resin substrate. The release film was then peeled off, thereby producing an insulating substrate having a thickness of 200 μm.

Using pieces of the resulting insulating substrate cut to a size of 50 mm×50 mm, as shown in Table 1, resin films having thicknesses of 1 μm, 3 μm and 5 μm were formed on the surface of the insulating substrate (Test Nos. 1 to 8). A resin composition containing an acrylic acid/styrene/2-ethylhexyl acrylate terpolymer (compounding ratio: 25 mass % acrylic acid, 55 mass % styrene, 20 mass % 2-ethylhexyl acrylate) and the ultraviolet absorber TINUVIN 571 ($\lambda_{max}$ (absorption maximum), 344 nm) was used as the resin film (Test No. 1 did not include ultraviolet absorber). Formation of the resin film was carried out by spin-coating an IPA solution of the resin composition (20% solids) onto one side of the insulating substrate, and drying at 120° C. for 30 minutes (resin film forming step). In Table 1, "amount of ultraviolet absorber added (%)" refers to the amount of ultraviolet absorber added with respect to the copolymer (mass %).

Then, recessed grooves and recessed holes (with bottoms) were formed by laser processing. The recessed grooves correspond to circuit grooves in the circuit pattern (for the formation of interconnections in the electrical circuit), and the recessed holes correspond to holes for pads in the circuit pattern (for the formation of pads in the electrical circuit). Specifically, ten recessed grooves, each linear in shape with a width of 20 μm and a length of 20 mm, were formed parallel to each other. The spaces between adjoining grooves were set to 15 μm. The depth of the grooves was set to 10 μm from the surface of the insulating substrate (that is, recessed portions having a depth that extended into the insulating substrate and exceeded the thickness of the resin film were formed). Six recessed holes, each square in shape and measuring 3 mm×3 mm, were formed. The depth of the recessed holes was set to 10 μm from the surface of the insulating substrate (that is, recessed portions having a depth that extended into the insulating substrate and exceeded the thickness of the resin film were formed). The recessed holes were formed in a staggered arrangement in the width direction and so as to slightly overlap each of the plurality of mutually parallel linear recessed grooves. An ESI model 5330 laser processing system equipped with a UV-YAG laser (laser light wavelength, 355 nm) was used for laser processing (circuit forming step).

Next, the insulating substrate in which recessed grooves and recessed holes had been formed was immersed in a cleaner/conditioner (surfactant solution; pH<1; C/N3320 from Rohm & Haas Electronic Materials KK), then rinsed with water. Soft etching treatment with a soft etchant (sodium persulfate-sulfuric acid system; pH<1) was then carried out. A pre-dipping step was subsequently carried out using PD404 (from Shipley Far East KK; pH<1). Next, by dipping in an acidic (pH 1) Pd—Sn colloidal solution containing stannous chloride and palladium chloride (CAT44, from Shipley Far East KK), palladium serving as nuclei for electroless copper plating was deposited on the insulating substrate in the state of a tin-palladium colloid (catalyst deposition step).

Next, palladium nuclei were generated by dipping the insulating substrate in a pH<1 accelerator solution (ACC19E, from Shipley Far East KK). The insulating substrate was then immersed for 10 minutes in an aqueous 5% sodium hydroxide solution (pH 14) while carrying out ultrasonic treatment (film removal step).

Next, electroless copper plating treatment was carried out by dipping the insulating substrate in an electroless copper plating solution (CM328A, CM328L, CM328C, from Shipley Far East KK) (plating treatment step).

In the above process, the absorbance coefficient at 355 nm of the resin film formed on the surface of the insulating substrate, the laser processability (exposure, residues, bulging) in the circuit forming step, the acid resistance in the catalyst deposition step, and the alkali strippability in the film removing step were evaluated as described below. The results are shown in Table 1. The alkali strippability was evaluated not only after the catalyst deposition step (indicated in Table 1 as "after plating nuclei deposition"), but also before the catalyst deposition step (indicated in Table 1 as "before plating nuclei deposition"). That is, the film removing step was carried out immediately after the circuit forming step.

[Absorbance Coefficient]

The resin film formed on the surface of the insulating substrate was dissolved in methanol, giving a methanol solution of the resin film (concentration, 0.40 g/L). The absorption spectrum of the resulting solution was measured using an ultraviolet-visible light spectrophotometer (UV-2100, from Shimadzu Corporation) (measurement range, 200 to 600 nm). Based on the spectral data obtained (absorbance A), the absorbance coefficient at 355 nm (absorbance coefficient ∈1 per unit weight) was calculated from the following formula.

$$\text{Absorbance } A \text{ at } 355 \text{ nm} = \in1 \text{ (L/(g·cm))} \times c \text{ (g/L: concentration of solution)} \times d\text{(cm: cell length)} \quad \text{[Formula]}$$

[Laser Processability]

With regard to "exposure" and "residues," the surface of the resin film following laser processing was examined with a scanning electron microscope (SEM), and these were rated according to the criteria shown below. With regard to "bulging," the thickness of the resin film was measured at five points in the 15 μm space (as the periphery of laser processed areas) between neighboring recessed grooves and, using the average of these values, the thickness of the resin film after laser processing was calculated in terms of the number of multiples (a multiple being represented in Table 1 as "x") of the thickness of the resin film before laser processing (with 2× or less being acceptable).

Criteria for Evaluating Exposure:

In these criteria for evaluation exposure, the "periphery of the recessed grooves or recessed holes" refers to the periphery of the laser processed areas and includes also, in addition to the periphery of the recessed grooves and the periphery of the recessed holes, spaces between one recessed groove and another recessed groove.

NG: There were at least two places per insulating substrate where the resin film at the periphery of recessed grooves or recessed holes was removed and the insulating substrate exposed.

Fair: There was only one place per insulating substrate where the resin film at the periphery of recessed grooves or recessed holes was removed and the insulating substrate exposed.

Good: There were no places where the resin film at the periphery of recessed grooves or recessed holes was removed and the insulating substrate exposed.

Criteria for Evaluating Residues:

NG: There were at least two places per insulating substrate where polymer components fell into recessed grooves or recessed holes and remained behind as residue.

Fair: There was only one place per insulating substrate where polymer components fell into recessed grooves or recessed holes and remained behind as residue.

Good: There were no places per insulating substrate where polymer components fell into recessed grooves or recessed holes and remained behind as residue.

[Acid Resistance]

The resin film surface following catalyst deposition and the resin film surface following plating treatment were examined with a scanning electron microscope, and the acid resistance was rated according to the following criteria.

Evaluation Criteria:

NG: There were at least two places per insulating substrate where the resin film following catalyst deposition peeled off or broke down, and where a plating film deposited following plating treatment.

Fair: There was only one place per insulating substrate where the resin film following catalyst deposition peeled off or broke down, and where a plating film deposited following plating treatment.

Good: There were no places per insulating substrate where the resin film following catalyst deposition peeled off or broke down, and where a plating film deposited following plating treatment.

[Alkali Strippability]

The resin film surface after dipping in an aqueous sodium hydroxide solution was examined with a scanning electron microscope and the alkali strippability was rated according to the following criteria.

Evaluation Criteria:

NG: There were at least two places per insulating substrate where the resin film remained present.

Fair: There was only one place per insulating substrate where the resin film remained present.

Good: There were no places per insulating substrate where the resin film remained present.

laser processability evaluation for "residues" was even better (see results for a resin film thickness of 3 μm in the table).

Also, in Test Nos. 4 to 8 having absorbance coefficients ∈1 of at least 0.1 (L/(g·cm)) (the amount of ultraviolet absorber added was at least 5 mass %), when compared with Test Nos. 2 and 3 in which this was less than 1.0 (L/(g·cm)) (wherein the amount of ultraviolet absorber added was 1 mass % or less), the laser processability evaluation for "residues" was even better (see results for a resin film thickness of 5 μm in the table).

With regard to bulging of the resin film, this was 2.0× or less (acceptable) in Test Nos. 5 to 8 at a resin film thickness of 1 μm, and was 2.0× or less (acceptable) in Test Nos. 2 to 8 at resin film thicknesses of 3 μm and 5 μm.

TABLE 1

| Test No. | | | 1 | 2 | 3 | 4 | 5 | 6 | 7 | 8 |
|---|---|---|---|---|---|---|---|---|---|---|
| Amount of ultraviolet absorber added (%) | | | 0 | 0.1 | 1 | 5 | 10 | 30 | 60 | 70 |
| Absorbance coefficient at 355 nm (L/(g · cm)) | | | 0 | 0.06 | 0.3 | 1.3 | 2.6 | 6.4 | 9.8 | 11.2 |
| Laser processability | 1 μm | Exposure | good | good | good | good | good | good | good | fair |
| | | Residues | NG | good | good | good | good | good | good | good |
| | | Bulging | 2.7× | 2.5× | 2.3× | 2.3× | 2.0× | 1.7× | 1.5× | 1.4× |
| | 3 μm | Exposure | good | good | good | good | good | good | good | good |
| | | Residues | NG | fair | good | good | good | good | good | good |
| | | Bulging | 2.6× | 1.7× | 1.6× | 1.4× | 1.3× | 0.9× | 0.8× | 0.7× |
| | 5 μm | Exposure | good | good | good | good | good | good | good | good |
| | | Residues | NG | fair | fair | good | good | good | good | good |
| | | Bulging | 2.1× | 1.8× | 1.5× | 1.2× | 1.2× | 1.0× | 0.8× | 0.7× |
| Acid resistance (1 to 5 μm) | | | good | good | good | good | good | good | good | good |
| Alkali strippability | Before plating nuclei deposition | 1 μm | good | good | good | good | good | good | good | good |
| | | 3 μm | good | good | good | good | good | good | good | good |
| | | 5 μm | good | good | good | good | good | good | good | good |
| | After plating nuclei deposition | 1 μm | good | good | good | good | good | good | good | good |
| | | 3 μm | good | good | good | good | good | good | good | good |
| | | 5 μm | good | good | good | good | good | good | good | good |

As is apparent from the results in Table 1, in Test No. 1 which did not include an ultraviolet absorber and had an absorbance coefficient ∈1 of 0 (zero), when compared with Test Nos. 2 to 8 which included an ultraviolet absorber and had absorbance coefficients ∈1 of at least 0.01 (L/(g·cm)), the evaluations of processability with regard to "residues" and "bulging" were inferior.

In Test Nos. 2 to 8 which included an ultraviolet absorber, had an absorbance coefficient ∈1 of at least 0.01 (L/(g·cm)), and in which the copolymer was a copolymer consisting of a first monomer containing a monomer unit having at least one carboxyl group and a second monomer copolymerizable with the first monomer, evaluations of the laser processability, acid resistance and alkali strippability were all good. Of these, in Test Nos. 2 to 7 having absorbance coefficients ∈1 of 10 (L/(g·cm)) or less, when compared with Test No. 8 in which this was more than 10 (L/(g·cm)), the laser processability evaluation for "exposure" was even better (see results for a resin film thickness of 1 μm in the table).

Also, in Test Nos. 2 to 7 which had amounts of ultraviolet absorber added with respect to the copolymer of from 0.1 to 60 mass %, when compared with Test No. 8 in which this was 70 mass %, the laser processability evaluation for "exposure" was even better (see results for a resin film thickness of 1 μm in the table).

In Test Nos. 3 to 8 having absorbance coefficients ∈1 of at least 0.1 (L/(g·cm)) (the amount of ultraviolet absorber added was at least 1 mass %), when compared with Test No. 2 in which this was less than 0.1 (L/(g·cm)) (wherein the amount of ultraviolet absorber added was 0.1 mass % or less), the The entire contents of Japanese Patent Application No. 2011-114652 filed on May 23, 2011, which serves as the basis of the present application, are incorporated herein by reference.

The invention has been fully and appropriately described above through embodiments while making reference to the drawing, although it should be recognized that persons of ordinary skill in the art will have the ability to easily modify and/or improve these embodiments. Therefore, unless the modifications or improvements practiced by those skilled in the art are of such a degree as to depart from the scope of the accompanying claims, such modifications or improvements shall be understood as being encompassed by the scope of the claims.

INDUSTRIAL APPLICABILITY

This invention has broad industrial applicability in technical fields relating to the formation of electrical circuits in the field of electricity and electronics.

EXPLANATION OF REFERENCE NUMERALS

1 Insulating substrate
2 Resin film (resist)
3 Grooves (recessed portions (circuit pattern))
4 Through-holes (recessed portions (circuit pattern))
5 Plating catalyst
6 Electrical circuit (electroless plating film)
10 Circuit board

The invention claimed is:

1. A resin composition comprising:
   a copolymer comprising a first monomer containing a monomer unit having at least one carboxyl group and a second monomer copolymerizable with the first monomer; and
   an ultraviolet absorber,
   wherein, when the resin composition forms a resin film and when $\in 1$ represents an absorbance coefficient per unit weight of the resin film in a solution prepared by dissolving the resin film in a solvent, $\in 1$ at a light wavelength at which the resin film is to be irradiated is at least 0.01 (L/(g·cm)) and wherein the first monomer is at least an $\alpha,\beta$-unsaturated carbonyl group-containing monomer selected from the group consisting of acrylic acid, methacrylic acid, itaconic acid, fumaric acid, maleic acid, and ester compounds thereof.

2. The resin composition according to claim 1, wherein the resin film possesses a characteristic that, when laser-processed with laser light of the wavelength at which the resin film is to be irradiated, the peripheral part of the laser-processed area of the resin film has a thickness after laser processing which is not more than twice the thickness before laser processing.

3. The resin composition according to claim 1, wherein the ultraviolet absorber is included in an amount of from 0.1 to 60 mass % relative to the copolymer.

4. The resin composition according to claim 1, wherein the ultraviolet absorber is at least one selected from the group consisting of benzotriazole derivatives, benzophenone derivatives, benzoate derivatives, triazine derivatives, benzothiazole derivatives and benzoyl methane.

5. The resin composition according to claim 1, wherein the copolymer comprises two or more monomers including from 10 to 90 mass % of an $\alpha,\beta$-unsaturated carbonyl group-containing monomer and from 10 to 90 mass % of another monomer which is copolymerizable therewith and has a polymerizable unsaturated group at a molecular end.

6. The resin composition according to claim 5, wherein the monomer having a polymerizable unsaturated group at a molecular end is at least one selected from the group consisting of styrene and diene skeleton-containing compounds.

7. The resin composition according to claim 1, wherein the copolymer has a weight-average molecular weight of from 5,000 to 1,000,000.

8. The resin composition according to claim 1, wherein the resin film has acid resistance and swells or dissolves in an alkaline solution.

9. The resin composition according to claim 8, wherein:
   a degree of swelling of the resin film in an acidic catalyst metal colloidal solution is smaller than a degree of swelling the resin film in an alkaline solution,
   the degree of swelling of the resin film in an acidic catalyst metal colloidal solution is 60% or less, and
   the degree of swelling thereof in an alkaline solution is at least 50%.

10. The resin composition according to claim 1, wherein the resin film is formed by applying the resin composition as a liquid to a substrate surface, then drying the applied resin composition.

11. The resin composition according to claim 1, wherein the resin film is formed by applying the resin composition as a liquid to a supporting substrate, then drying the applied resin composition to form an initial resin film, and transferring the initial resin film to a substrate surface.

12. The resin composition according to claim 1, wherein the ultraviolet absorber has an absorption wavelength in the range of 250 to 400 nm.

13. The resin composition according to claim 1, wherein the copolymer has an absorption wavelength in the range of 200 to 300 nm.

* * * * *